US 8,816,376 B2

United States Patent
Ohno

(10) Patent No.: US 8,816,376 B2
(45) Date of Patent: Aug. 26, 2014

(54) SEMICONDUCTOR LIGHT EMITTING DEVICE

(71) Applicant: Panasonic Corporation, Osaka (JP)

(72) Inventor: Hiroshi Ohno, Osaka (JP)

(73) Assignee: Panasonic Corporation, Kadoma-Shi, Osaka (JP)

( * ) Notice: Subject to any disclaimer, the term of this patent is extended or adjusted under 35 U.S.C. 154(b) by 0 days.

(21) Appl. No.: 13/756,579

(22) Filed: Feb. 1, 2013

(65) Prior Publication Data

US 2013/0292723 A1 Nov. 7, 2013

Related U.S. Application Data

(63) Continuation of application No. PCT/JP2010/007346, filed on Dec. 17, 2010.

(30) Foreign Application Priority Data

Aug. 18, 2010 (JP) .................................. 2010-183316

(51) Int. Cl.
*H01L 33/58* (2010.01)
*H01L 33/00* (2010.01)

(52) U.S. Cl.
CPC ............ *H01L 33/58* (2013.01); *H01L 33/0045* (2013.01)
USPC ......................................................... 257/98

(58) Field of Classification Search
CPC ...... H01L 33/0045; H01L 33/58; H01L 33/60
USPC ......................................................... 257/98
See application file for complete search history.

(56) References Cited

U.S. PATENT DOCUMENTS

| 7,019,325 B2 * | 3/2006 | Li et al. ............................ 257/14 |
| 2002/0020847 A1 * | 2/2002 | Horie et al. ...................... 257/98 |
| 2002/0024052 A1 | 2/2002 | Liang et al. |

(Continued)

FOREIGN PATENT DOCUMENTS

| JP | 2003-142777 | 5/2003 |
| JP | 4106210 B | 5/2003 |
| JP | 2006-352159 | 12/2006 |

OTHER PUBLICATIONS

International Search Report of PCT Application No. PCT/JP2010/007346 dated Mar. 1, 2011.
"High-Power Superluminescent Diodes," Alphonse et al., IEEE Journal of Quantum Electronics, vol. 24, No. 12, pp. 2454-2457, Dec. 1988.

(Continued)

*Primary Examiner* — Olik Chaudhuri
*Assistant Examiner* — Christine Enad
(74) *Attorney, Agent, or Firm* — McDermott Will & Emery LLP

(57) ABSTRACT

A semiconductor light emitting device includes a multilayer structure formed on a substrate and including a plurality of semiconductor layers including a light-emitting layer. The multilayer structure includes an optical waveguide having ridge structure provided at an upper part of the multilayer structure. The optical waveguide extends from a front facet to a rear facet of the multilayer structure, and includes a straight waveguide section which is inclined to a normal to the front facet of the multilayer structure and extends from the front facet, and a curved waveguide section which perpendicularly reaches the rear facet of the multilayer structure. The curved waveguide section is closer to the rear facet of the multilayer structure than a center of the optical waveguide is.

21 Claims, 14 Drawing Sheets

(56) References Cited

U.S. PATENT DOCUMENTS

2007/0126027 A1* 6/2007 Morishima .................. 257/192
2010/0085998 A1   4/2010 Igarashi
2010/0238962 A1* 9/2010 Oh et al. .................. 372/45.01

OTHER PUBLICATIONS

"Broadband blue superluminescent light-emitting diodes based on GaN," E. Feltin et al., Applied Physics Letters 95, 081107, 2009.

* cited by examiner

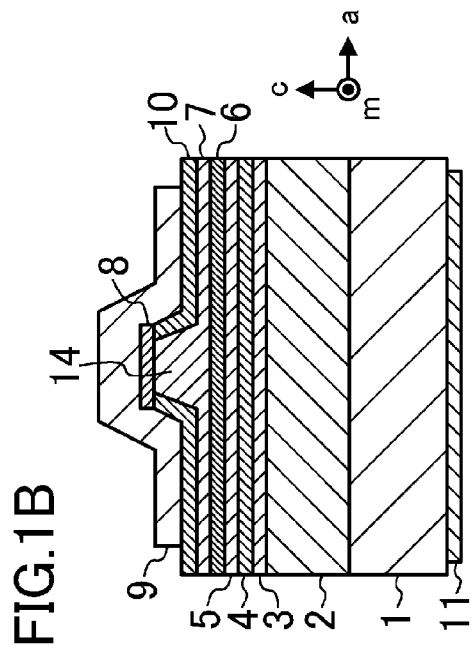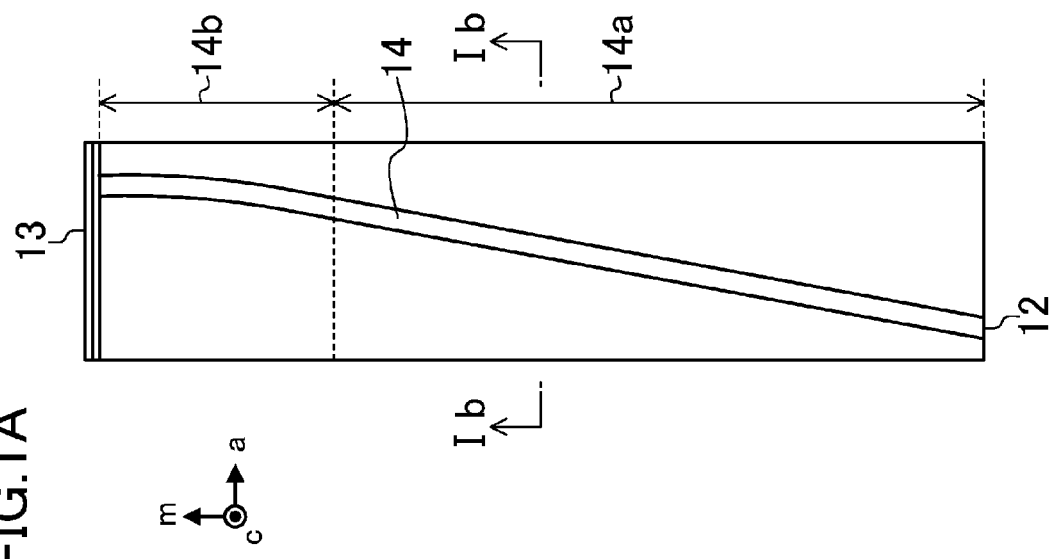

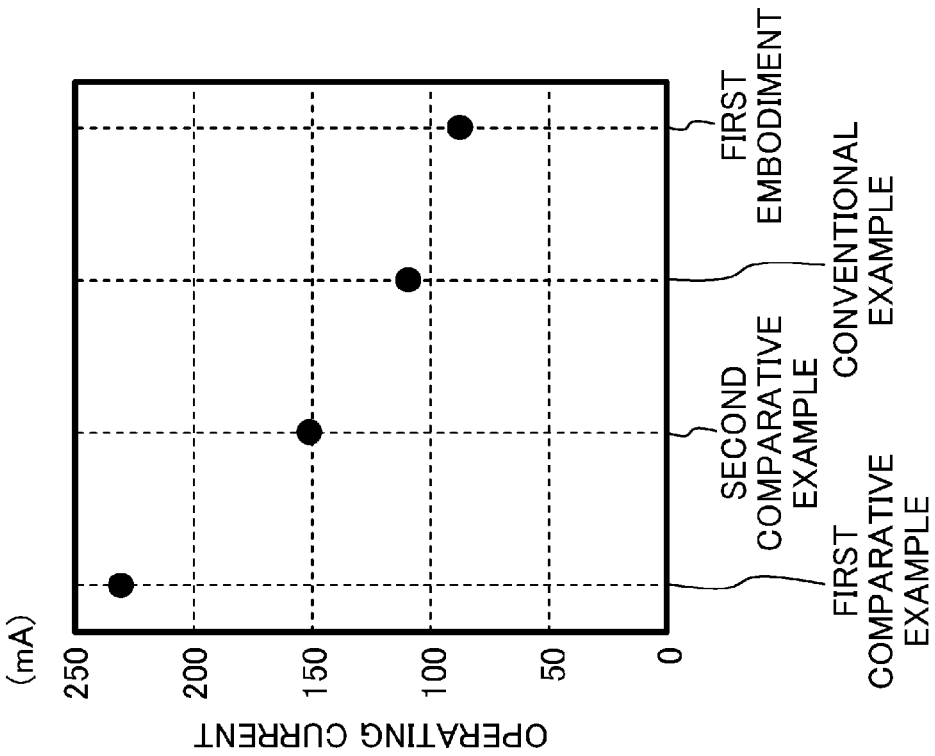
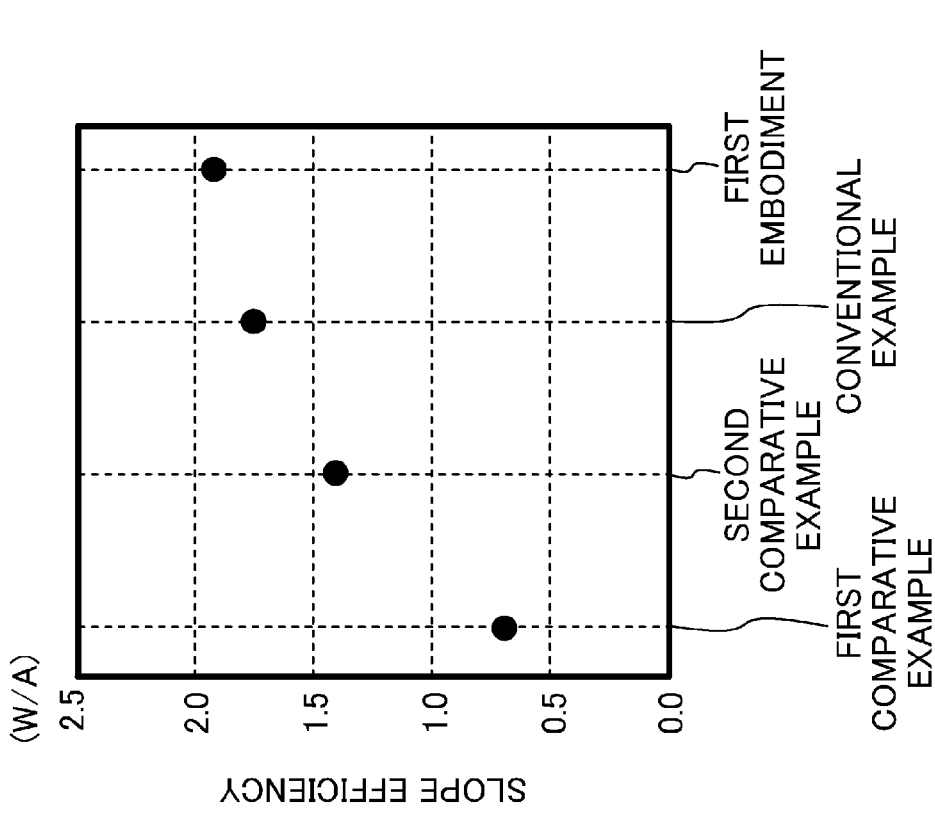
FIG.4A
FIG.4B

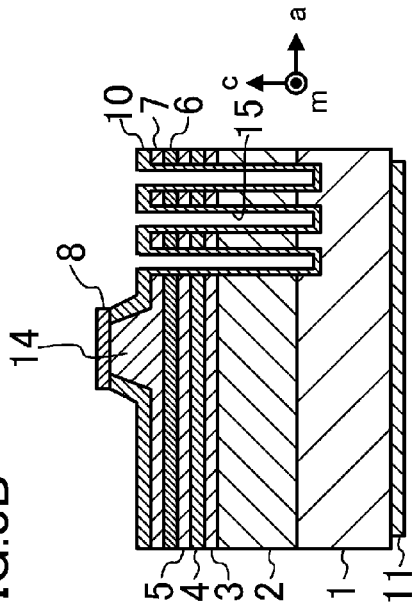
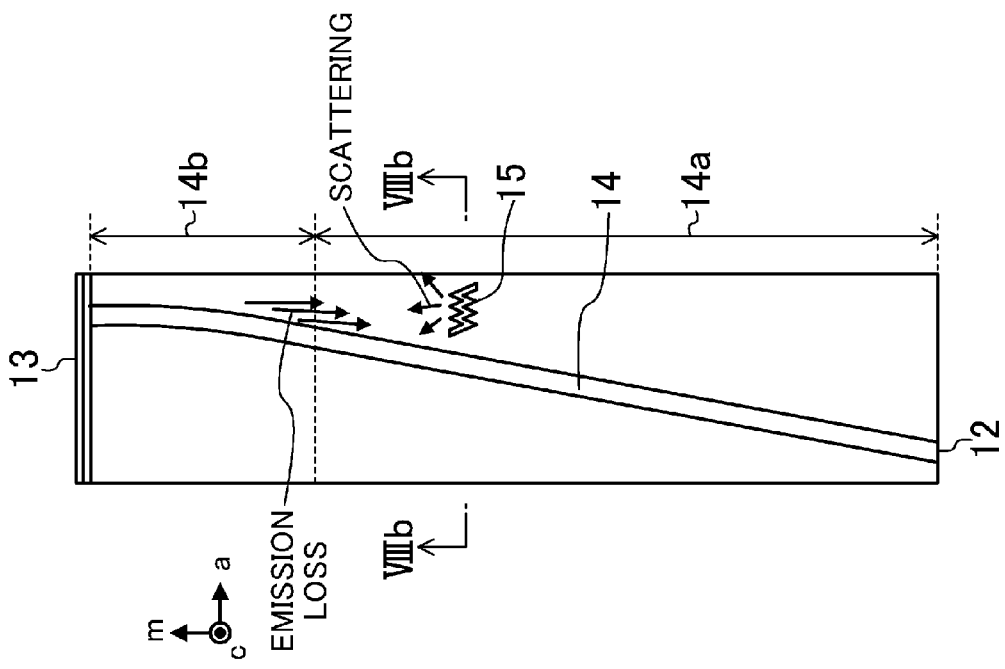
FIG.8A
FIG.8B

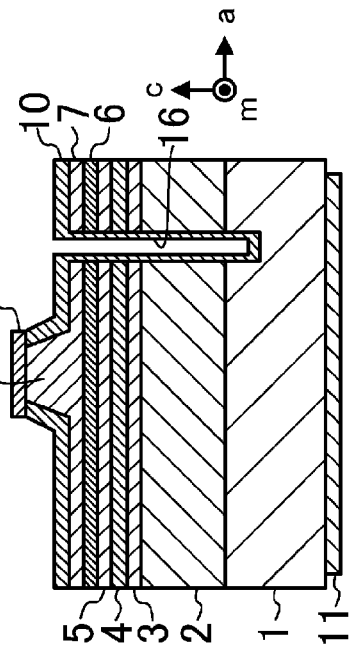
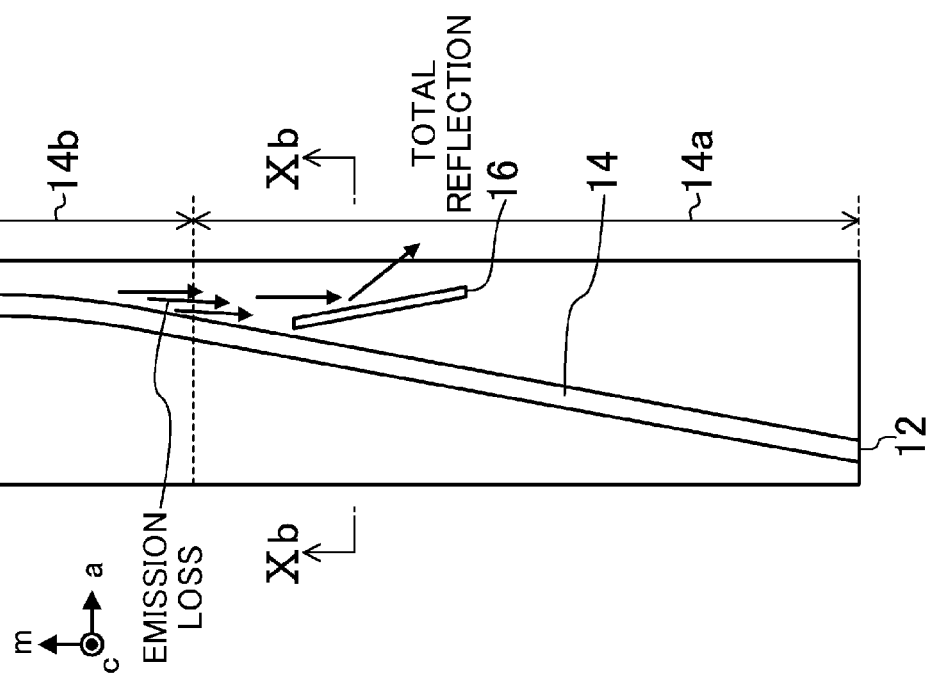

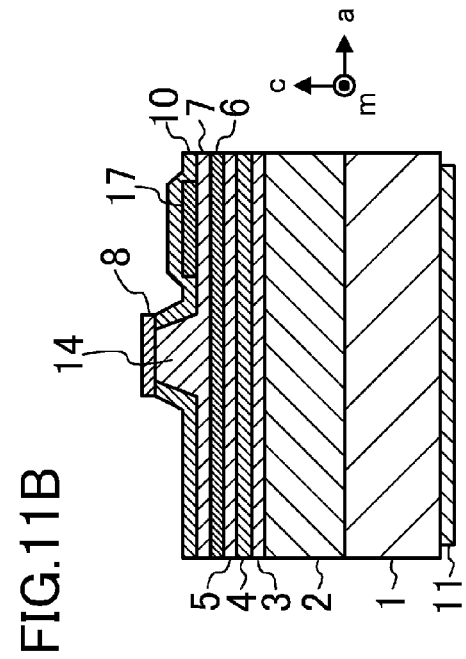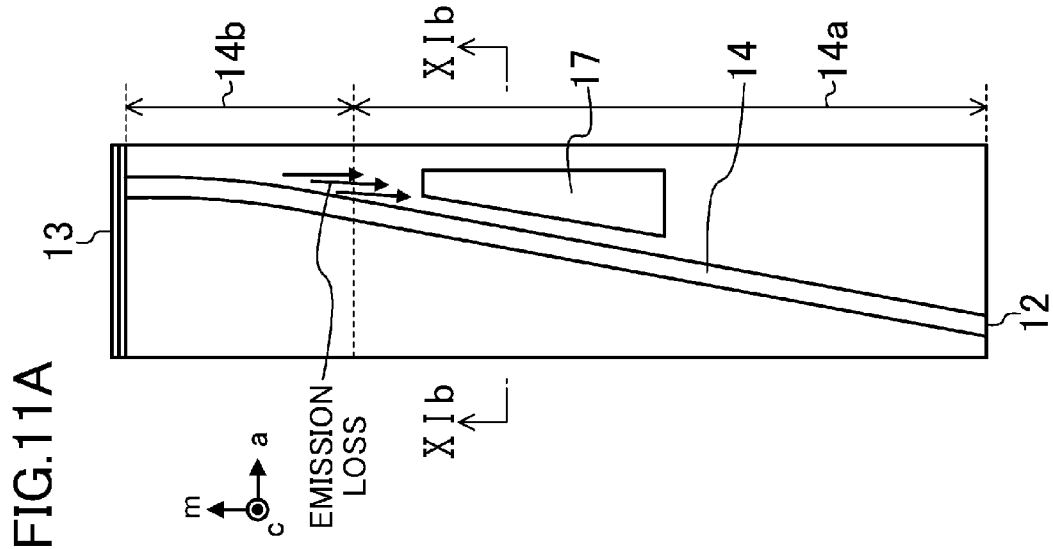
FIG.11A
FIG.11B

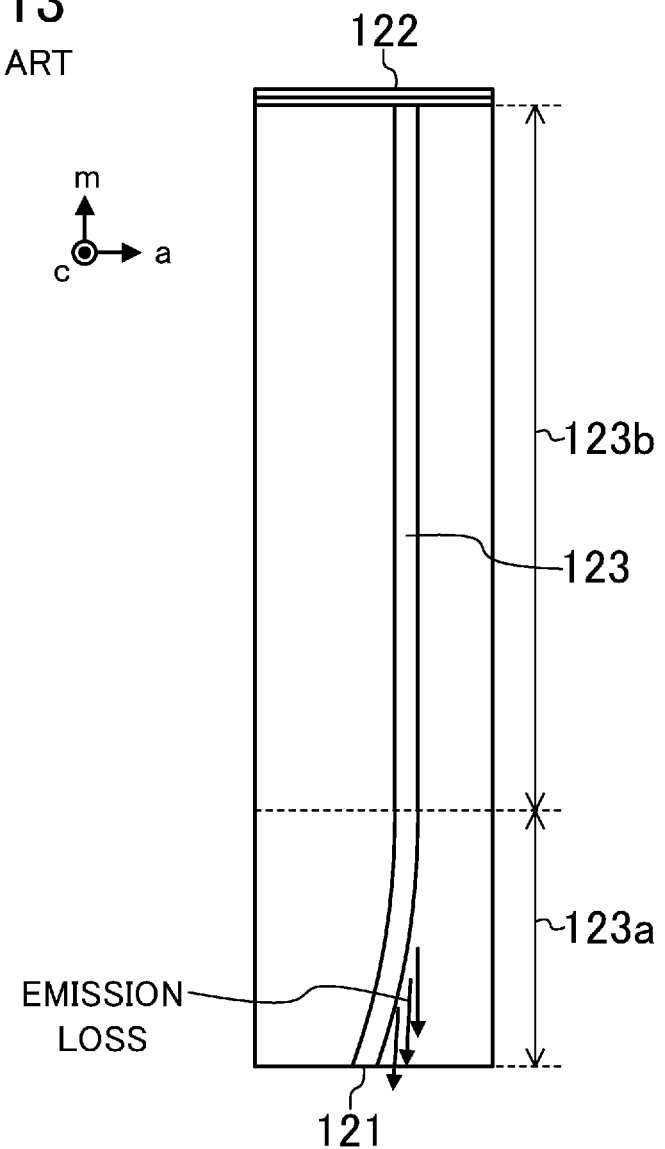

SEMICONDUCTOR LIGHT EMITTING DEVICE

CROSS-REFERENCE TO RELATED APPLICATIONS

This is a continuation of International Application No. PCT/JP2010/007346 filed on Dec. 17, 2010, which claims priority to Japanese Patent Application No. 2010-183316 filed on Aug. 18, 2010. The entire disclosures of these applications are incorporated by reference herein.

BACKGROUND

The present disclosure relates to semiconductor light emitting devices, and specifically to a super luminescent diode (SLD) device capable of emitting blue-violet to red light in the visible range.

Semiconductor light emitting devices such as light emitting diodes (LEDs), laser diodes (LDs), and the like have excellent features such as a small size and a high output, and thus are used in diverse technical fields including IT technologies, such as communication and optical disks, as well as medicine, illumination, etc. In recent years, the use of LEDs as light sources of liquid crystal display devices, such as flat-screen television sets, using liquid crystal panels has been rapidly increasing. Such a liquid crystal display device includes a liquid crystal panel as a transmissive light modulator element, and a light source device disposed on a back surface of the liquid crystal panel emits light to illuminate the liquid crystal panel. The liquid crystal panel controls the transmittance of the light emitted from the light source device, thereby forming an image.

Conventionally, a cold cathode fluorescent lamp (CCFL) has been used as a light source of the light source device. However, in recent years, with the trend toward energy conservation, LED backlight sources using LED chips are being developed. Existing LED backlight sources generally use a mode in which a white LED obtained by mixing a blue LED with a yellow fluorescent material, and are broadly divided into a direct-lit type and an edge-lit type based on arrangement of LEDs. In the direct-lit type, LED light sources are arranged directly under a liquid crystal panel in a grid pattern, and thus the direct-lit type is suitable to a technique to increase the contrast ratio of an image by local dimming in which the brightness of the light sources are controlled region-by-region. However, the direct-lit type has problems, for example, where reducing the thickness is difficult. The edge-lit type includes LED light sources arranged in the periphery of a liquid crystal panel, and the entire panel is illuminated by using a light guide plate, so that reducing the thickness of the panel is easy, and the edge-lit type has the advantage of increasing designability. Also in terms of cost, the edge-lit type has the advantage of reducing the number of mounted LEDs can be reduced.

For edge-lit type backlight sources, characteristics such as high directivity, high polarization performance, etc. are primarily beneficial, but existing LED light sources do not have such characteristics, and are not optimized as light sources. Examples of small-sized light sources having high directivity and high polarization performance include LDs, but the LDs have high coherence of light, and thus have a problem where speckle noise is easily generated.

Thus, as light sources having high directivity, high polarization performance, and low coherence, the inventors of the present application focused attention on super luminescent diodes (SLDs). Like LDs, the SLDs are semiconductor light emitting devices including optical waveguides. In the SLDs, while light spontaneously emitted due to recombination of injected carriers advances toward a light-emitting facet, the light is amplified by receiving a higher gain by stimulated emission, and is emitted from the light-emitting facet. The SLDs are different from the LDs in that formation of optical resonators due to facet reflection is reduced, so that laser oscillation due to the Fabry-Perot mode is not caused. Thus, like ordinary light emitting diodes, the SLDs exhibit an incoherent and wideband spectral line shape, and can generate an output of up to about several tens of milliwatts. In particular, SLDs using nitride semiconductors are expected to serve as high output incoherent light sources which covers from an ultraviolet range to a green color in the visible range.

As described above, when the SLDs, which are light sources having high directivity, high polarization performance, and low coherence, are used as edge-lid backlight sources, the optical coupling efficiency between the SLDs and the light guide plate is improved, and the polarizing plate can be omitted. Thus, the SLDs are expected to serve as higher-performance low-cost backlight sources.

Conventional SLDs will be described with reference to FIGS. 13-14.

Conventional Example

For example, Japanese Patent Publication 2003-142777 has proposed, as illustrated in FIG. 13, a structure in which only the reflectance of a front facet 121 can be reduced by forming a ridge-shaped waveguide 123 including a straight waveguide section 123a and a curved waveguide section 123b. When an inclined facet is formed by the curved waveguide section 123b, both a rear facet 122 having a high reflectance and a front facet 121 having a low reflectance can be formed by cleaving, which provides the advantage that the reflectance can be precisely controlled.

SUMMARY

However, an SLD including the curved waveguide section according to the conventional example involves waveguide loss due to the curved waveguide section, which results in an increase in operating current. Moreover, light emitted in the curved waveguide section is also output from the front facet, and thus interferes with a far field pattern (FFP) in the horizontal direction, so that the shape of the light significantly deviates from a Gaussian shape as illustrated in FIG. 14.

In view of the above-discussed problems, a semiconductor light emitting device of the present disclosure includes a curved optical waveguide facing a rear facet of an optical waveguide.

Specifically, an example semiconductor light emitting device includes: a multilayer structure formed on a substrate and including a plurality of semiconductor layers including a light-emitting layer; wherein the multilayer structure includes an optical waveguide having a ridge structure provided at an upper part of the multilayer structure, the optical waveguide extends from a front facet to a rear facet of the multilayer structure, and includes a straight waveguide section which is inclined to a normal to the front facet of the multilayer structure and extends from the front facet, and a curved waveguide section which perpendicularly reaches the rear facet of the multilayer structure, and the curved waveguide section is formed at a position closer to the rear facet of the multilayer structure than a center of the optical waveguide is.

In the semiconductor light emitting device according to the present disclosure, the curved waveguide section is provided at a rear facet side where the optical density is low, so that waveguide loss in the curved waveguide section can be reduced.

In the semiconductor light emitting device according to the present disclosure, a high reflectance film including a plurality of dielectric films is preferably formed on the rear facet of the multilayer structure.

With this configuration, the amplification length of light can be two times as long as the resonator length, and amplification effect by stimulated emission can be increased.

In the semiconductor light emitting device according to the present disclosure, an extremely-low-reflectance film including one or more dielectric films is preferably formed on the front facet of the multilayer structure.

With this configuration, the reflectance of the front facet can further be reduced from $1/10$ to $1/100$. Thus, laser oscillation is further reduced, and a semiconductor light emitting device which allows the SLD to generate a high output is obtained.

In the semiconductor light emitting device according to the present disclosure, a functional section configured to reduce propagation of light escaped from the curved waveguide section to the front facet of the multilayer structure is preferably formed in a peripheral portion of the straight waveguide section in the multilayer structure in a region in a direction in which a tangent of the curved waveguide section is extended toward the front facet.

In this case, the functional section is preferably a scattering groove section configured to scatter light.

With this configuration, light escaped from the curved waveguide section is scattered by the scattering groove section, and thus does not reach the front facet. Thus, it is possible to reduce distortion of a horizontal FFP of light emission.

Alternatively, the functional section may be a straight total-reflection groove section configured to totally reflect light.

Here, an angle between a normal in a longitudinal direction of the straight total-reflection groove section and a direction in which the straight waveguide extends is preferably larger than a critical angle.

With this configuration, light escaped from the curved waveguide section is totally reflected by the total-reflection groove section, and thus does not reach the front facet. Thus, it is possible to reduce distortion of a horizontal FFP of light emission.

In the semiconductor light emitting device according to the present disclosure, the functional section may be an absorption portion configured to absorb light.

With this configuration, light escaped from the curved waveguide section is absorbed by the absorption portion, and thus does not reach the front facet. Thus, it is possible to reduce distortion of a horizontal FFP of light emission.

In the semiconductor light emitting device according to the present disclosure, the multilayer structure may have lateral facets, and the lateral facets have a lower degree of flatness than the front facet and the rear facet of the multilayer structure, incline from a normal direction of the front facet in a same direction as the straight waveguide section, and are formed side-by-side with the straight waveguide section.

In this case, the lateral facets of the multilayer structure are preferably parallel to the straight waveguide section.

With this configuration, before light escaped from the curved waveguide section reaches the front facet, the light reaches the left and right facets, so that the light is scattered by fine asperities on the left and right facets and is output outside the device. Thus, it is possible to reduce distortion of a horizontal FFP of light emission.

In the semiconductor light emitting device according to the present disclosure, a radius of curvature of the curved waveguide section is preferably 1000 µm or larger.

With this configuration, waveguide loss in the curved waveguide section can be minimized, and a semiconductor light emitting device having higher efficiency can be fabricated.

In the semiconductor light emitting device according to the present disclosure, an angle between the straight waveguide section and the normal to the front facet of the multilayer structure is preferably larger than or equal to 4° and is preferably smaller than or equal to Brewster's angle.

With this configuration, the reflectance of the front facet can be reduced to $1 \times 10^{-4}$ or less. Thus, a semiconductor light emitting device having higher efficiency can be obtained.

In the semiconductor light emitting device according to the present disclosure, the semiconductor light emitting device is preferably a super luminescent diode element configured to emit stimulated emission light from the front facet of the multilayer structure.

In the semiconductor light emitting device according to the present disclosure, the semiconductor layer preferably include a layer made of a group III nitride semiconductor expressed as $Al_xGa_yIn_{1-x-y}N$, where $0 \leq x \leq 1$, $0 \leq y \leq 1$, and $0 \leq x+y \leq 1$.

With this configuration, the semiconductor light emitting device can be used as blue and green light sources having high directivity, high polarization performance, and low coherence. In particular, when a blue SLD light source is used in combination with a yellow color fluorescent material or green and red color fluorescent materials, the blue SLD light source can serve as a white light source.

In the semiconductor light emitting device according to the present disclosure, the semiconductor layer may include a layer made of a group III-V compound semiconductor expressed as $Al_xGa_yIn_{1-x-y}As_zP_{1-z}$, where $0 \leq x \leq 1$, $0 \leq y < 1$, $0 \leq z \leq 1$, and $0 \leq x+y \leq 1$.

With this configuration, the semiconductor light emitting device can be used as a red light source having high directivity, high polarization performance, and low coherence. Moreover, blue, green, and red SLD light sources can also serve as a backlight source and a display light source having high color-reproducibility.

As described above, according to the semiconductor light emitting device in the present disclosure, a highly-efficient semiconductor light emitting device whose luminous efficiency is improved, and which has high directivity, high polarization performance, and low coherence can be obtained.

BRIEF DESCRIPTION OF THE DRAWINGS

FIGS. 1A and 1B are views illustrating a semiconductor light emitting device according to a first embodiment of the present disclosure, wherein FIG. 1A is a plan view, and FIG. 1B is a cross-sectional view along the line Ib-Ib of FIG. 1A.

FIG. 4A is a graph illustrating comparison between the semiconductor light emitting device according to the first embodiment of the present disclosure, a first comparative example, a second comparative example, and the conventional example in terms of slope efficiency at an output of 50 mW, and FIG. 4B is a graph illustrating comparison between the semiconductor light emitting device according to first embodiment of the present disclosure, a first comparative example, a second comparative example, and the conventional example in terms of operating current at an output of 50 mW.

FIGS. 8A and 8B are views illustrating a semiconductor light emitting device according to a second embodiment of the present disclosure, wherein FIG. 8A is a plan view, and FIG. 8B is a cross-sectional view along the line VIIIb-VIIIb of FIG. 8A.

FIGS. 10A and 10B are views illustrating a semiconductor light emitting device according to a third embodiment of the present disclosure, wherein FIG. 10A is a plan view, and FIG. 10B is a cross-sectional view along the line Xb-Xb of FIG. 10A.

FIGS. 11A and 11B are views illustrating a semiconductor light emitting device according to a fourth embodiment of the present disclosure, wherein FIG. 11A is a plan view, and FIG. 11B is a cross-sectional view along the line XIb-XIb of FIG. 11A.

FIGS. 12A and 12B are views illustrating a semiconductor light emitting device according to a fifth embodiment of the present disclosure, wherein FIG. 12A is a plan view, and FIG. 12B is a cross-sectional view along the line XIIb-XIIb of FIG. 12A.

FIG. 13 is a plan view illustrating a semiconductor light emitting device of a conventional example.

DETAILED DESCRIPTION

Figure 2:
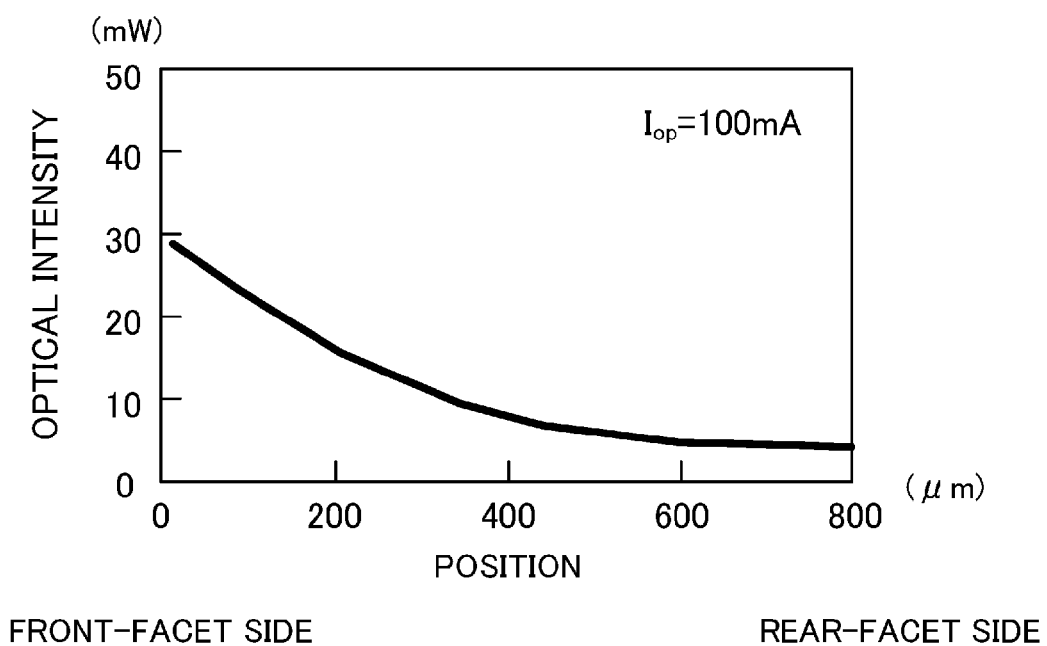
FIG. 2 is a graph illustrating the relationship between the optical intensity and positions in the optical waveguide of the semiconductor light emitting device according to first embodiment of the present disclosure.

Embodiments according to the present disclosure will be described with reference to the drawings. The embodiments described below are mere examples of the present disclosure, and are not intended to limit the present disclosure.

First Embodiment

In a first embodiment of the present disclosure, a blue super luminescent diode (SLD) device which includes a nitride semiconductor and emits blue light having a wavelength of 450 nm will be described as a semiconductor light emitting device.

As illustrated in FIGS. 1A and 1B, the semiconductor light emitting device according to the present embodiment includes a multilayer structure formed on an n-type gallium nitride (GaN) substrate 1. Specifically, a buffer layer (not shown) made of n-type GaN, an n-type clad layer 2, an n-type guide layer 3, an active layer 4 serving as a light-emitting layer, a p-type guide layer 5, a carrier overflow stop (OFS) layer 6 made of p-type aluminum gallium nitride (AlGaN), a p-type clad layer 7, and a p-type GaN contact layer (not shown) are sequentially formed on the n-type GaN substrate 1. An upper part of the p-type clad layer 7 is processed into a ridge-stripe geometry, thereby forming a ridge waveguide 14 serving as an optical waveguide. A dielectric block layer 10 made of silicon oxide ($SiO_2$) is formed on the p-type clad layer 7. The dielectric block layer 10 has openings in which a top face of a ridge stripe portion is exposed. A p-side electrode 8 is formed on the top face of the ridge stripe portion. An interconnect electrode 9 which is connected to the p-side electrode 8 is formed on the p-side electrode 8 and the dielectric block layer 10. An n-side electrode 11 is formed on a face (rear face) of the n-type GaN substrate 1 opposite to the n-type clad layer 2.

A front facet 12 and a rear facet 13 each serving as a light output surface are formed at both ends of the ridge waveguide 14 in the longitudinal direction. The front facet 12 is made of, for example, a dielectric multilayer film, and has a low optical reflectance. The rear facet 13 is made of, for example, a dielectric multilayer film, and has an optical reflectance of 90% or higher. The ridge waveguide 14 includes a straight waveguide section 14a, and a curved waveguide section 14b. The straight waveguide section 14a is inclined at about 4-22° to the normal to the front facet 12, and extends from the front facet 12. The curved waveguide section 14b is closer to the rear facet 13 than the center of the ridge waveguide 14 is, and the curved waveguide section 14b perpendicularly reaches the rear facet 13.

In FIG. 1A, plane orientations of a hexagonal GaN-based crystal are denoted by symbols c, a, and m. The symbol c represents a normal vector whose plane orientation is a (0001) plane, that is, a c axis. The symbol a represents a normal vector whose plane orientations are a (11-20) plane and an equivalent plane of the (11-20) plane, that is, an a axis. The symbol m represents a normal vector whose plane orientations are a (1-100) plane and an equivalent plane of the (1-100) plane, that is, an m axis. Here, in the present specification, the minus sign "−" put in front of the Miller index of the plane orientation expediently represents an inversion of an index following the minus sign.

In the semiconductor light emitting device according to the first embodiment, the ridge waveguide 14 includes the straight waveguide section 14a which is inclined to the normal to the front facet 12 (output surface), and which extends from the front facet 12, and the curved waveguide section 14b, which is provided closer to the rear facet 13 than the center of the ridge waveguide 14 is, and which perpendicularly reaches the rear facet 13. Thus, the ridge waveguide 14 can reduce waveguide loss, and can increase luminous efficiency.

A method for fabricating the semiconductor light emitting device according to the first embodiment of the present disclosure will be described.

(Crystal Growth Step)

First, for example, an n-type clad layer 2 is formed on a main surface of a hexagonal crystalline n-type GaN substrate 1 by metal organic chemical vapor deposition (MOCVD). A plane orientation of the main surface of the hexagonal crystalline n-type GaN substrate 1 is a (0001) plane, and the hexagonal crystalline n-type GaN substrate 1 has a carrier concentration of about $1 \times 10^{18}$ cm$^{-3}$. The n-type clad layer 2 has a thickness of about 2 μm, and is made of n-type $Al_{0.03}Ga_{0.97}N$. Subsequently, an n-type guide layer 3 and an active layer 4 are sequentially formed on the n-type clad layer 2. The n-type guide layer 3 has a thickness of, for example, about 0.10 μm, and is made of n-type GaN. The active layer 4 has a quantum well structure including three cycles of barrier and quantum well layers, where each barrier layer is made of $In_{0.02}Ga_{0.98}N$, and each quantum well layer is made of $In_{0.16}Ga_{0.84}N$. Subsequently, a p-type guide layer 5 which has a thickness of, for example, about 0.05 μm, and is made of undoped or p-type GaN is formed on the active layer 4. Subsequently, an OFS layer 6 which has a thickness of, for example, about 20 nm, and is made of $Al_{0.20}Ga_{0.80}N$ is formed on the p-type guide layer 5. Subsequently, a p-type clad layer 7 and a p-type contact layer (not shown) are sequentially formed on the OFS layer 6. The p-type clad layer 7 includes 160 cycles of p-type $Al_{0.06}Ga_{0.94}N$ layers and GaN layers each having a thickness of about 2 nm, and the p-type clad layer 7 has a thickness of about 0.50 μm and is a strained superlattice layer. The p-type contact layer has a thickness of about 0.1 μnm, and is made of p-type GaN.

Each of the n-type semiconductor layers is doped with silicon (Si) as a donor impurity at a concentration of about $5 \times 10^{17}$ cm$^{-3}$. Moreover, each of the p-type semiconductor layers is doped with magnesium (Mg) as an acceptor impurity at a concentration of about $1 \times 10^{19}$ cm$^{-3}$. Note that the p-type contact layer, which is an uppermost layer, is doped with Mg at a high concentration of about $1 \times 10^{20}$ cm$^{-3}$. Moreover, the composition of Al in the OFS layer 6 is set to as high as 20%, thereby increasing a band gap. This can reduce non-radiative recombination in the semiconductor layers other than the active layer 4, where the non-radiative recombination is caused because electrons in a conduction band have a higher mobility than positive holes in a valence band, and thus the electrons pass through the active layer 4.

The multilayer structure of the semiconductor according to the present embodiment is a mere example, and is not intended to limit the multilayer structure and growth methods of the layers. For example, as a crystal growth method in forming the multilayer structure, a method such as molecular beam epitaxy (MBE), chemical beam epitaxy (CBE), or the like by which a layered structure of a GaN-based semiconductor can be grown may be used instead of MOCVD.

As materials in MOCVD, for example, trimethylgallium (TMG) as a gallium (Ga) material, trimethyl indium (TMI) as an indium (In) material, trimethyl aluminum (TMA) as an Al material, and ammonia ($NH_3$) as a nitrogen (N) material may be used. Moreover, silane ($SiH_4$) gas may be used as a Si material which is an n-type impurity, and his cyclopentadienyl magnesium ($Cp_2Mg$) may be used as a Mg material which is a p-type impurity.

(Ridge Waveguide Formation Step)

Next, a first $SiO_2$ film (not shown) having a thickness of about 200 nm is deposited on the entire surface of the p-type contact layer by chemical vapor deposition (CVD). Then, a thermal treatment is performed on the multilayer structure under a nitrogen ($N_2$) atmosphere at about 850° C. for 30 minutes, thereby activating Mg in each of the p-type semiconductor layers. Subsequently, the first $SiO_2$ film is etched by dry etching such as lithography, reactive ion etching (RIE), and the like, thereby forming a mask film made of $SiO_2$ in a region on the p-type contact layer in which the ridge waveguide 14 will be formed. Then, by using the formed mask film, the p-type contact layer and an upper part of the p-type clad layer 7 under the p-type contact layer are etched by about 0.5 μm by inductively coupled plasma (ICP) dry etching using chlorine ($Cl_2$) gas, silicon tetrachloride ($SiCl_4$) gas, or gas based on chlorine such as boron trichloride ($BCl_3$), thereby forming a ridge waveguide 14 which is a ridge stripe portion including a straight waveguide section 14a and a curved waveguide section 14b. Here, in general, the amount of etching is precisely controlled by monitoring an interference pattern by using an ultraviolet light source. Here, the width of a base of the ridge waveguide 14 is about 1.2 μm.

Note that, in the ridge waveguide formation step, groove portions may be formed on both sides of the ridge waveguide 14 to form seat portions having the same height as a top face of the ridge waveguide 14 on both sides of the ridge waveguide 14. With this configuration, only the ridge waveguide 14 forms a raised portion, thereby preventing SLD elements from mechanical damage during a mounting process, or the like. Note that the interval between the ridge waveguide 14 and each of the seat portions is preferably about 5-15 μm.

(Dielectric Block Layer and p-Side Electrode Formation Step)

Subsequently, the mask film is removed by a buffer hydrofluoric acid solution (BHF). Then, a second $SiO_2$ film having a thickness of about 300 nm is deposited on the entire surface of the n-type GaN substrate 1 by performing CVD again. Subsequently, by lithography and wet etching using the buffer hydrofluoric acid solution, openings in which the top face of the ridge waveguide 14, that is, the p-type contact layer is exposed are formed in the second $SiO_2$ film, thereby forming a dielectric block layer 10. Note that instead of lithography, an etchback process may be performed on a formed resist film in order to form the openings in the dielectric block layer 10.

Subsequently, p-side electrodes 8 each including a palladium (Pd) film and a platinum (Pt) film are formed by electron beam deposition in the openings in the dielectric block layer 10. The electron beam deposition is performed with the multilayer structure being heated to about 70° C., where the Pd film and the Pt film each have a thickness of about 50 nm. Then, a thermal treatment at a temperature of about 400° C. is performed, thereby obtaining satisfactory contact resistance of $2 \times 10^{-4}$ Ωcm$^2$ or lower. As a result of researches on the temperature during a vapor deposition process, it was found that the contact resistance and adherence are most improved when the multilayer structure is heated to about 70-100° C. Moreover, considering heat resisting properties of a resist used for patterning, a preferable condition to improve the contact resistance without a reduction in process yield is that vapor deposition is performed at a temperature of about 70° C.

(Interconnect Electrode Formation Step)

Next, an interconnect electrode 9 including a titanium (Ti) film, a platinum (Pt) film, and a gold (Au) film is formed by lithography and electron beam deposition on the p-side electrodes 8 and the dielectric block layer 10 so that the interconnect electrode is electrically connected to the p-side electrode 8. Here, the Ti film has a thickness of about 50 nm, the Pt film has a thickness of about 50 nm, and the Au film has a thickness of about 500 nm.

Note that in general, the n-type GaN substrate 1 is in a wafer state, and a plurality of semiconductor light emitting devices are formed in a matrix pattern on the main surface of the n-type GaN substrate 1. Thus, if the interconnect electrode 9 is continuously formed between the devices, the p-side electrodes 8 bonded to the interconnect electrode 9 may be detached from the p-type contact layer when individual semiconductor light emitting devices are divided from the n-type GaN substrate 1 in a wafer state by cleaving. Thus, the interconnect electrode 9 is preferably separated between the adjacent devices. Moreover, when the thickness of the Au layer, which is an outermost layer included in the interconnect electrode 9, is increased to 3 μm or larger by electroplating to form a pad electrode (not shown), heat generated from the active layer 4 can be effectively released. That is, the pad electrode which has a thickness of 3 μm or larger and is made of Au can improve reliability of the semiconductor light emitting device according to the first embodiment.

(Rear Face Electrode Formation Step)

Next, the thickness of the n-type GaN substrate 1 is reduced to about 100 μm by grinding and polishing a rear face of the n-type GaN substrate 1. Then, on the rear face of the n-type GaN substrate 1 whose thickness has been reduced, an n-side electrode 11 including Ti, Pt, and Au films is formed. Here, the Ti film has a thickness of about 10 nm, the Pt film has a thickness of about 50 nm, and the Au film has a thickness of about 100 nm With this configuration, it is possible to obtain satisfactory contact resistance of $1 \times 10^{-4}$ $\Omega cm^2$ or lower. Here, as a recognition pattern in a subsequent cleavage and assembly step, an electrode pattern is preferably formed by etching only the Au film, which is an outermost layer included in the n-side electrode 11, by lithography and wet etching. Alternatively, the electrode pattern may be formed by lithography and a deposition and lift-off method.

Note that a method for polishing the n-type GaN substrate 1 includes, for example, mechanical polishing using diamond slurry or colloidal silica, or chemodynamic polishing using an alkaline solution such as a potassium hydroxide (KOH) solution.

(Cleavage and Assembly Step)

Next, a supplemental groove for cleavage is formed in a cleaving position on the wafer by scribing the position on the wafer by a diamond stylus or a laser. Then, breaking and primary cleavage are performed along the formed supplemental groove for cleavage, thereby forming a front facet 12 and a rear facet 13 which is opposite to the front facet 12, where the front facet 12 and the rear facet 13 are light-emitting facets. Subsequently, a multilayer dielectric reflective film having an optical reflectance of about 95% is formed on the rear facet 13 by CVD or sputtering. In the same manner, a non-reflective film made of a single-layer or multilayer dielectric film may be formed on the front facet 12 in order to further reduce the reflectance. Then, secondary cleavage is performed in a direction parallel to the longitudinal direction of a resonator, and a mounting process to a desired CAN package and an interconnecting process are performed. The semiconductor light emitting device according to the first embodiment of the present disclosure can thus be obtained.

Next, distribution of optical intensity of the ridge waveguide will be described, where the optical reflectance of the front facet is $1 \times 10^{-5}$, the optical reflectance of the rear facet is 95%, and an operating current ($I_{op}$) is 100 mA. Here, the optical intensity refers to optical intensity at a position in the waveguide in a waveguide direction, and strictly speaking, an integral of light distribution and optical density in a waveguide plane. As illustrated in FIG. 2, a SLD device has a high optical reflectance at its rear facet and a very low optical reflectance at its front facet. Thus, the difference in optical intensity between the front facet and the rear facet is very large. Loss due to the curved waveguide section can be reduced as much as possible by forming a curved waveguide section in a region where the optical intensity is low. That is, when the curved waveguide section is formed at a rear facet side, waveguide loss can be reduced to or lower than ⅕ of that of the case where the curved waveguide section is formed at a front facet side. Note that in the present specification, a probability that light guided through the ridge waveguide is reflected at a facet and returns to the ridge waveguide is defined as the optical reflectance (mode reflectance).

Figure 3A:
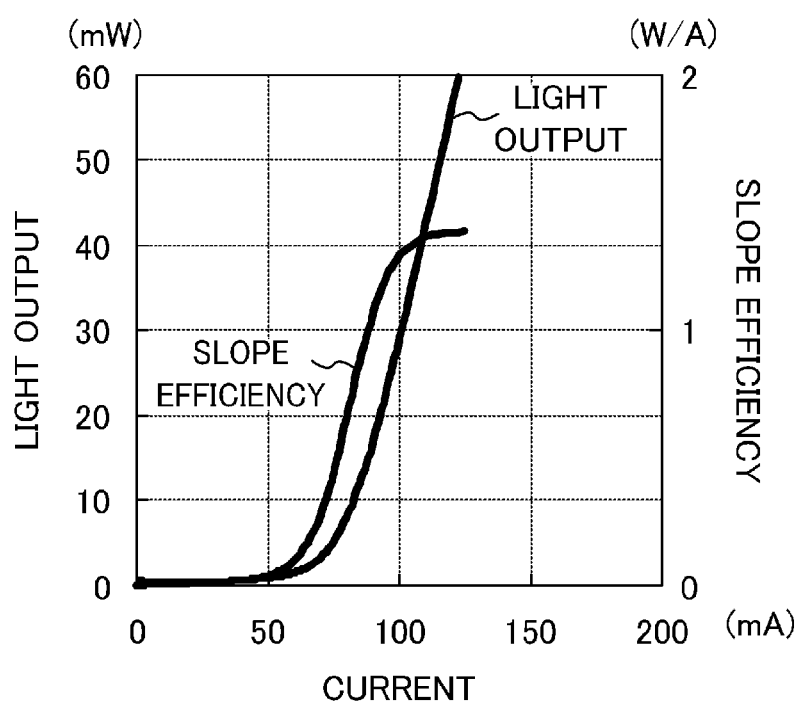
FIG. 3A is a graph illustrating a typical relationship among currents, light output characteristics, and the slope efficiency of the semiconductor light emitting device according to the first embodiment of the present disclosure.
Figure 3B:
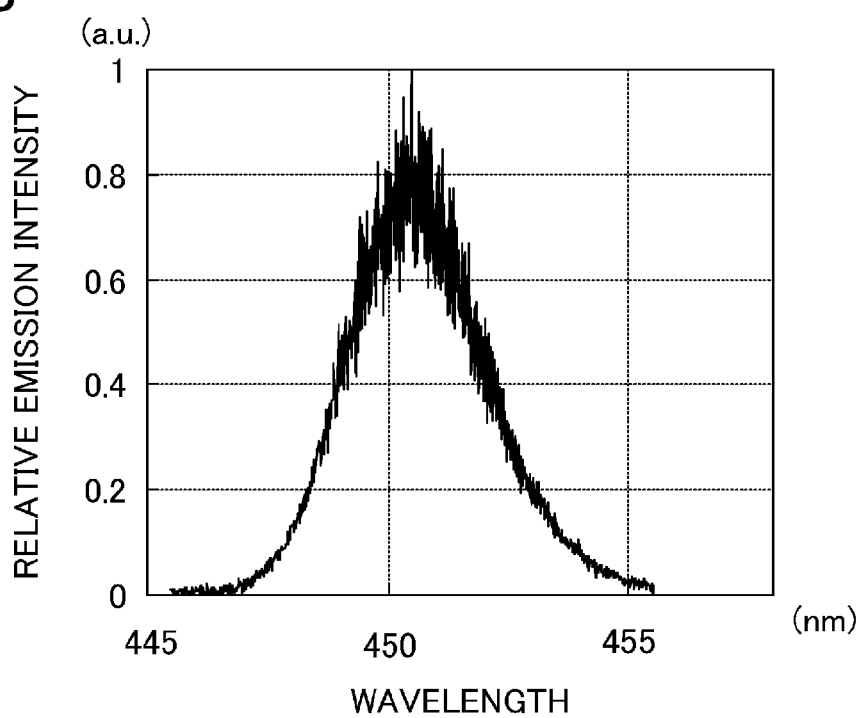
FIG. 3B is a graph illustrating a typical emission spectrum of the semiconductor light emitting device according to the first embodiment of the present disclosure.

Moreover, as illustrated in FIG. 3A, unlike general laser devices, the optical reflectance at the front facet of the semiconductor light emitting device according to the present embodiment is very low, and thus the semiconductor light emitting device is not brought into an oscillating state, and a light output has a tendency to be exponentially increased during rising time of the light output. Moreover, the semiconductor light emitting device operates with its carrier density being higher than that of the laser devices, and thus the gain in the ridge waveguide increases, thereby increasing a slope efficiency (Se=dP/dI), so that a high-efficiency light emitting device can be obtained. The slope efficiency exhibits a tendency to saturate at a light output of about 50 mW, but the semiconductor light emitting device is not in a laser oscillation state, and thus as illustrated in FIG. 3B, an emission spectrum is broad, and coherence is low. Thus, using the semiconductor light emitting device according to the present embodiment as a light source can reduce speckle noise.

Next, the semiconductor light emitting devices according to a first comparative example, a second comparative example, the conventional example illustrated in FIG. 13, and the first embodiment of the disclosure are compared to one another in terms of saturated slope efficiency and the operating current when the devices generate an output of 50 mW. Note that the first comparative example is a semiconductor light emitting device as proposed in, for example, J. Quantum Electronics Vol. 24, No. 12, pp. 2454-2457 (1988). This semiconductor light emitting device has a structure in which the entirety of a waveguide is made of straight waveguide sections, and light-emitting facets are inclined relative to the waveguide. The second comparative example is a semiconductor light emitting device as proposed in, for example, Appl. Phys. Lett. 081107(95) 2009. This semiconductor light emitting device has a structure in which a front facet is formed into an inclined facet by etching to reduce the reflectance of the front facet, and the reflectance of the rear facet is increased to easily obtain the amplification effect by the stimulated emission. As illustrated in FIGS. 4A and 4B, the first embodiment including the rear facet which is a high reflective facet and the front facet which is an inclined low reflective facet formed by cleaving allows the SLD to operate at high efficiency and to generate a high output compared to the first and second comparative examples. The first comparative example is different from the first embodiment in that the reflectance of a front facet and the reflectance of a rear facet are both reduced, and light is emitted from both the facets. Thus, it is difficult in the first comparative example to obtain an amplification effect by stimulated emission. Moreover, the second comparative example is different from the first embodiment in that compared to the case where a facet is formed by cleaving, forming a low reflectance facet by etching does not reduce the reflectance as much as computed due to the influence of damages and fine asperities on the surface. Thus, the SLD operation of generating a high output is difficult in the second comparative example. As in the first embodiment, forming the curved waveguide section at the rear facet side where the optical density is low can increase the efficiency by 10-20% compared to the conventional example.

Forming the curved waveguide section at the rear facet side can reduce loss due to the curved waveguide section. However, this configuration cannot satisfactorily reduce the loss, and thus it is beneficial to reduce the loss in the curved waveguide section itself. The loss per unit length in the curved waveguide section depends on the radius of curvature, and thus the smaller the radius of curvature is (the sharper the curve is), the larger the loss is. Moreover, the entire loss is given by multiplying the loss per unit length by the bending length. Thus, when the entire bending angle is determined, it is possible to determine a combination of the radius of curvature and the bending length which can minimize the loss. Note that, the entire bending angle is equal to an angle of a normal to the front facet and the straight waveguide section (hereinafter referred to as a facet angle).

Figure 5A:
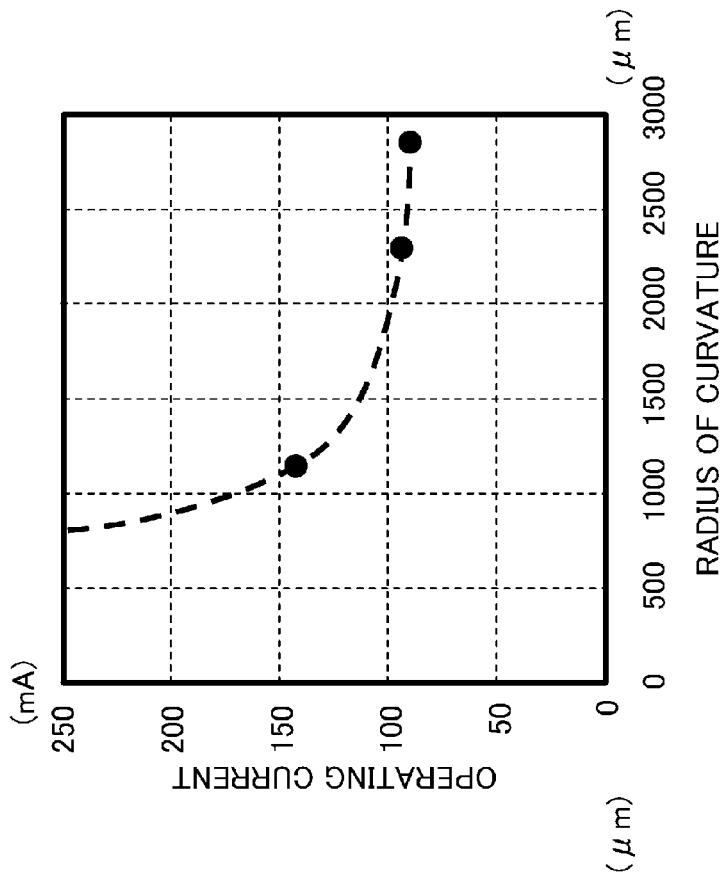
FIG. 5A is a graph illustrating the dependency of the slope efficiency on the radius of curvature when the semiconductor light emitting device according to the first embodiment of the present disclosure generates an output of 50 mW.
Figure 5B:
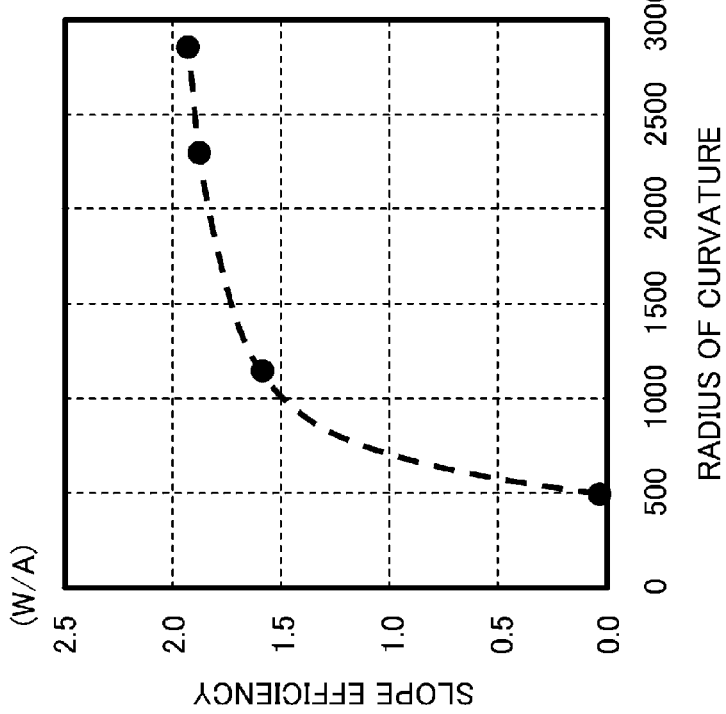
FIG. 5B is a graph illustrating the dependency of the operating current on the radius of curvature when the semiconductor light emitting device according to the first embodiment of the present disclosure generates an output of 50 mW.

Next, the dependency of the saturated slope efficiency and the operating current on the radius of curvature of the curved waveguide section when the semiconductor light emitting device according to the first embodiment generates an output of 50 mW will be described, where the entire bending angle is constant, and is 10°. As illustrated in FIGS. 5A and 5B, when the radius of curvature is 500 μm or smaller, the loss is large, and the efficiency is very low, whereas when the radius of curvature is 1000 μm or larger, the loss is reduced, and high efficiency can be obtained. Note that in general, a suitable radius of curvature, which varies more or less along with a change in device configuration, is preferably about 1000 μm or larger.

Figure 6:
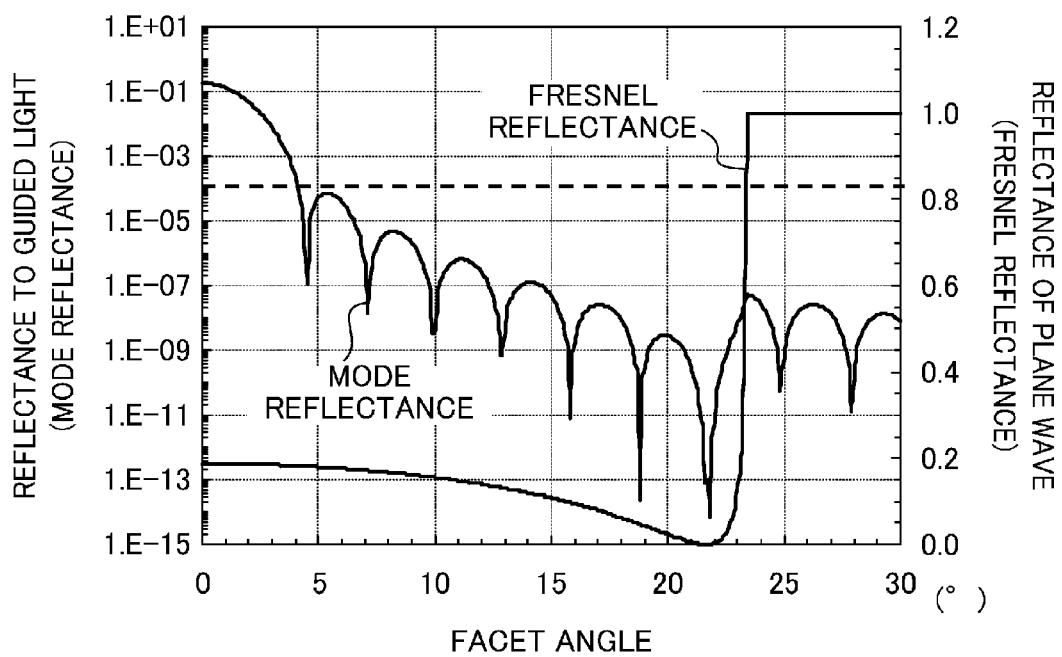
FIG. 6 is a graph illustrating the facet angle dependency of the optical reflectance on guided light of the semiconductor light emitting device according to the first embodiment of the present disclosure.

Next, the dependency of the optical reflectance to light guided through the ridge waveguide (mode reflectance) and the reflectance of a plane wave (Fresnel reflectance) of the semiconductor light emitting device according to the first embodiment on the facet angle will be described. As illustrated in FIG. 6, when the facet angle is 4° or larger, the optical reflectance is $1\times10^{-4}$ or smaller, and thus a beneficial low reflectance for the SLD operation can be obtained. Moreover, the optical reflectance is minimum at a Brewster's angle) (22°). In order to allow the SLD to generate a high output, it is preferable that the facet angle be as large as possible provided that the facet angle is smaller than or equal to the Brewster's angle. However, in a semiconductor light emitting device using a curved waveguide section, the radius of curvature has to be reduced, or the bending length has to be increased, and thus the entire loss tends to be increased.

Figure 7A:
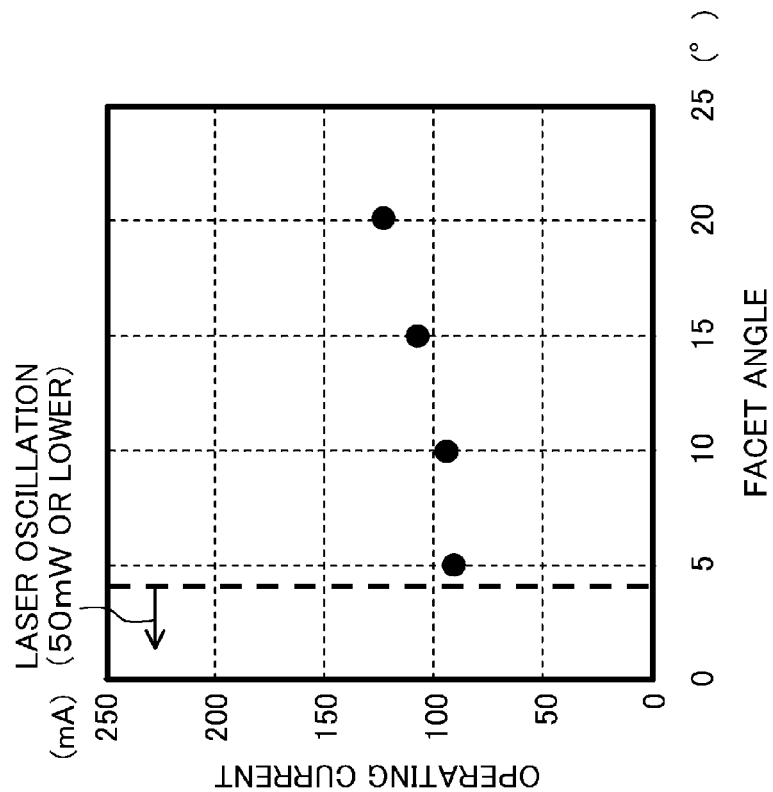
FIG. 7A is a graph illustrating the dependency of the slope efficiency on the radius of curvature when the semiconductor light emitting device according to the first embodiment of the present disclosure generates an output of 50 mW.
Figure 7B:
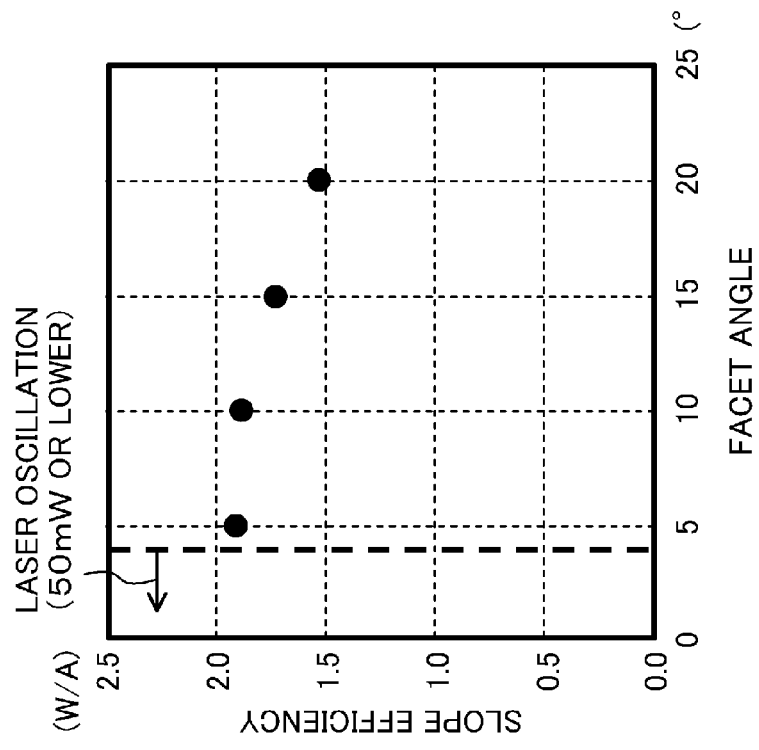
FIG. 7B is a graph illustrating the facet angle dependency of the operating current when the semiconductor light emitting device according to the first embodiment of the present disclosure generates an output of 50 mW.

Next, the dependency of the saturated slope efficiency and the operating current on the inclination angle of the front facet when the semiconductor light emitting device according to the first embodiment generates an output of 50 mW will be described, where the radius of curvature is constant, and is 2300 μm. As illustrated in FIG. 7, when the facet angle is smaller than 4°, laser oscillation occurs at 50 mW or lower. Thus, it is difficult for the SLD to generate a high output. Moreover, when the facet angle is 15° or larger, the loss in the curved waveguide section gradually increases, and the efficiency has a tendency to be reduced. The optimal value of the facet angle also depends on the size of the radius of curvature. Moreover, when an inclined facet formed by etching is used together, the loss in the curved waveguide section can be reduced, and thus the facet angle is preferably larger than or equal to 4° and smaller than or equal to the Brewster's angle.

Second Embodiment

Figure 9:
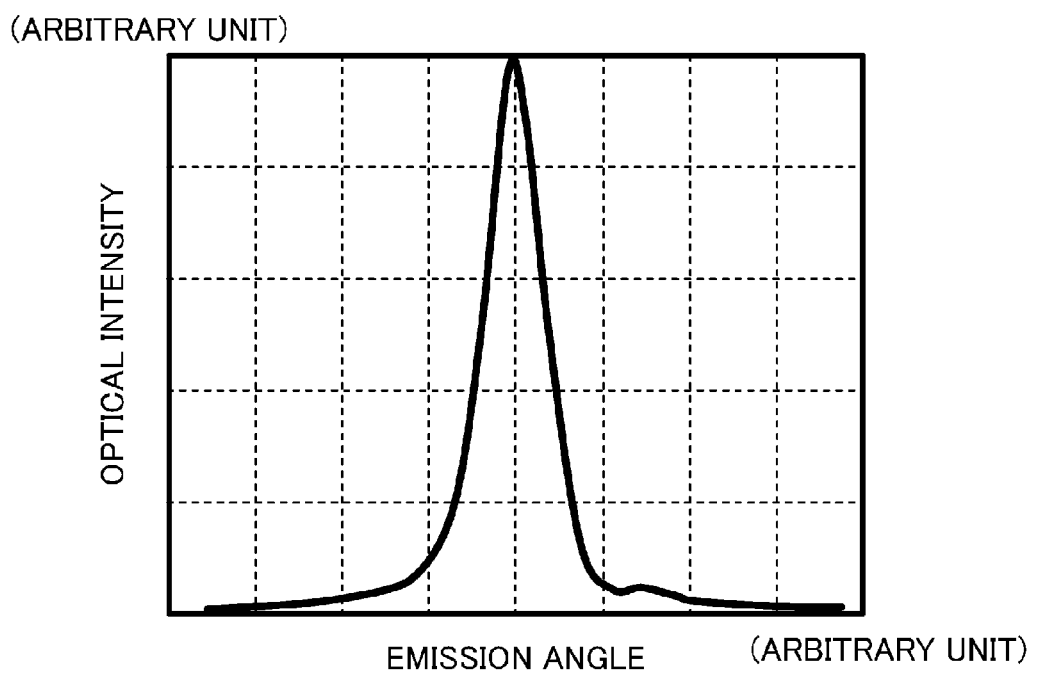
FIG. 9 is a graph illustrating a typical horizontal FFP of the semiconductor light emitting device according to the second embodiment of the present disclosure.

A semiconductor light emitting device according to a second embodiment of the present disclosure will be described below with reference to FIG. 8 and FIG. 9. Explanation of components having the same configurations as those of the first embodiment is omitted.

As illustrated in FIGS. 8A and 8B, the semiconductor light emitting device according to the present embodiment is different from the first embodiment in that scattering groove 15 which scatters light escaped from a curved waveguide section 14b is formed in a multilayer structure. Here, the scattering groove 15 is formed in a peripheral portion of a straight waveguide section 14a in a region in a direction in which the tangent of the curved waveguide section 14b extends toward a front facet 12. The scattering groove 15 preferably extends through an n-type guide layer 3 to an n-type clad layer 2 or an n-type GaN substrate 1. Moreover, in a manner similar to the ridge waveguide formation step, the scattering groove 15 may be formed by photolithography and dry etching. The scattering groove 15 is formed, for example, such that grooves extending in a plurality of directions are in communication with each other. With this configuration, light escaped from the curved waveguide section 14b is scattered by the scattering groove 15, so that it is possible to reduce light which escapes from the front facet 12. Thus, as illustrated in FIG. 9, it is possible to reduce distortion of a horizontal FFP.

According to the semiconductor light emitting device of the second embodiment, it is possible to provide a device which can produce a very satisfactory and horizontal FFP without distortion, and has high efficiency.

Third Embodiment

A third embodiment of the present disclosure will be described below with reference to FIG. 10. Explanation of components having the same configurations as those of the first embodiment is omitted.

As illustrated in FIGS. 10A and 10B, a semiconductor light emitting device according to the present embodiment is different from the first embodiment in that a total-reflection groove 16 which allows total reflection of light escaped from a curved waveguide section 14b is formed in a multilayer structure. Here, the total-reflection groove 16 is formed in a peripheral portion of a straight waveguide section 14a in a region in a direction in which the tangent of the curved waveguide section 14b is extended toward a front facet 12. The total-reflection groove 16 preferably extends through an n-type guide layer 3 to an n-type clad layer 2 or an n-type GaN substrate 1. Moreover, in a manner similar to the ridge waveguide formation step, the total-reflection groove 16 may be formed by photolithography and dry etching. In order to allow total reflection of the escaped light, an angle between the normal to a reflection plane (longitudinal direction) of the total-reflection groove 16 and a direction in which the straight waveguide section 14a extends has to be larger than the critical angle. With this configuration, the total-reflection groove 16 allows total reflection of the light escaped from the curved waveguide section 14b, so that it is possible to reduce light which escapes from the front facet 12. Thus, it is possible to reduce distortion of a horizontal FFP.

According to the semiconductor light emitting device of the third embodiment, it is possible to provide a device which

Fourth Embodiment

A fourth embodiment of the present disclosure will be described below with reference to FIG. 11. Explanation of components having the same configurations as those of the first embodiment is omitted.

As illustrated in FIG. 11A and 11B, a semiconductor light emitting device according to the present embodiment is different from the first embodiment in that a multilayer structure has a light absorption portion 17. In the case where the semiconductor light emitting device is a blue SLD device, the light absorption portion 17 may be a material having the property of absorbing blue light emission, and is made of, for example, amorphous Si having a thickness of 50 nm. Moreover, the light absorption portion 17 is formed in a peripheral portion of a straight waveguide section 14a in a region in a direction in which the tangent of the curved waveguide section 14b extends toward a front facet 12 and between a dielectric block layer 10 and a bottom surface of the ridge waveguide 14 in a p-type clad layer 7. In a manner similar to the electrode formation step, the light absorption portion 17 may be formed by photolithography, electron beam deposition, and a lift-off method. With this configuration, light escaped from the curved waveguide section 14b is absorbed by the light absorption portion 17, and thus it is possible to reduce light which escapes from the front facet 12. Thus, it is possible to reduce distortion of a horizontal FFP.

According to the semiconductor light emitting device of the fourth embodiment, it is possible to provide a device which can produce a very satisfactory and horizontal FFP without distortion, and has high efficiency.

Fifth Embodiment

A fifth embodiment of the present disclosure will be described below with reference to FIG. 12. Explanation of components having the same configurations as those of the first embodiment is omitted.

Figure 12A:
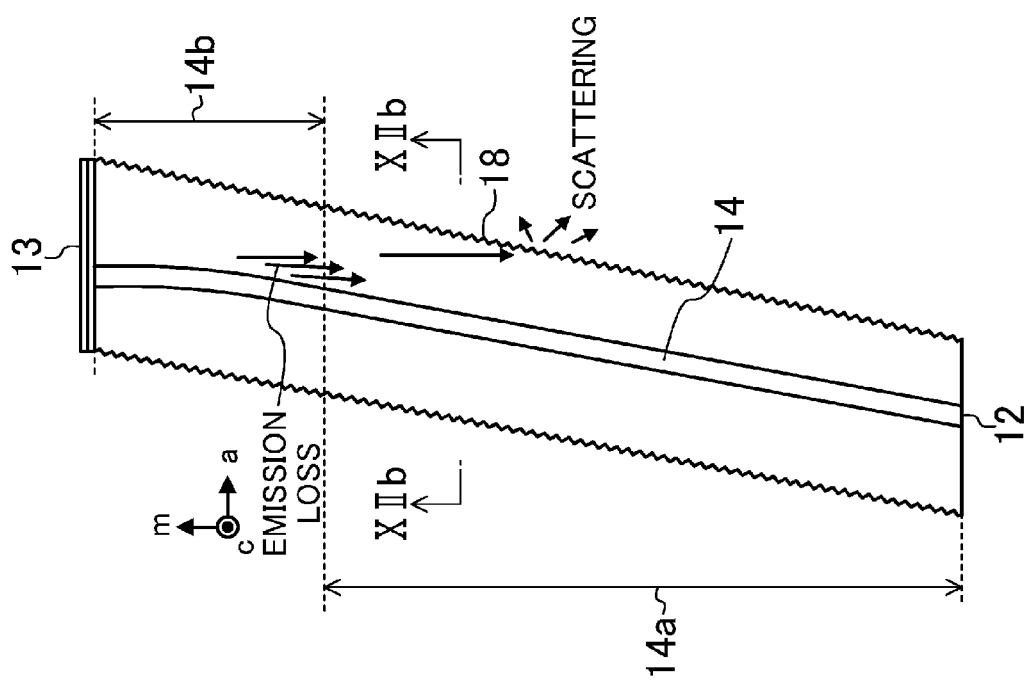
Figure 12B:
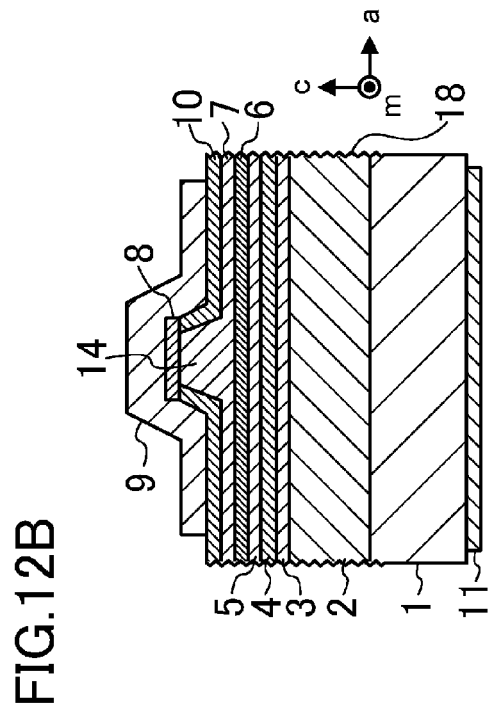
Figure 14:
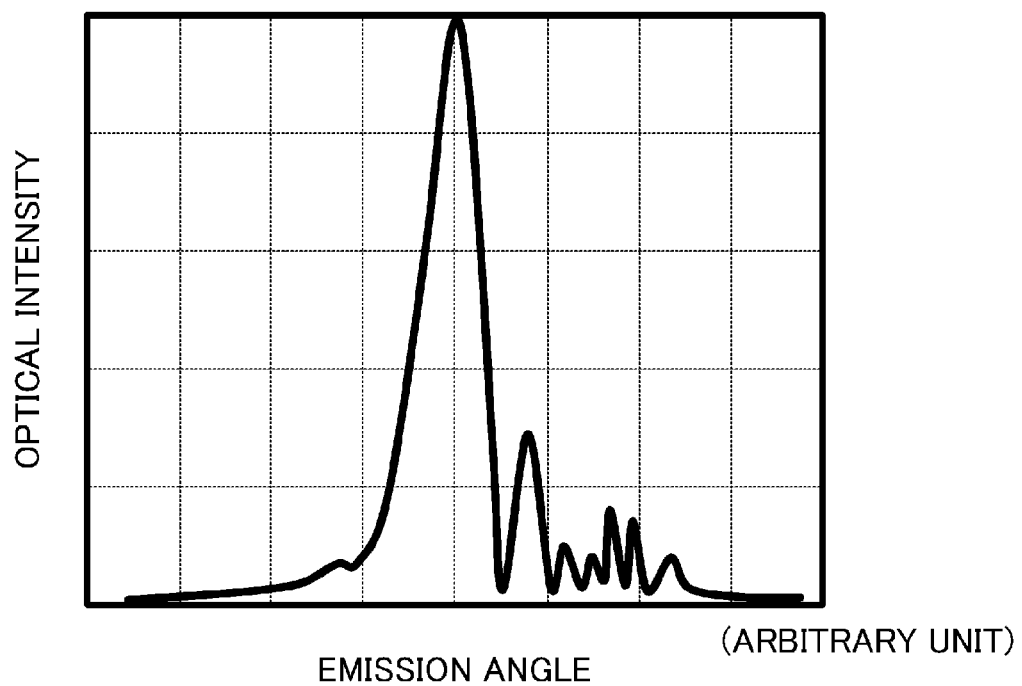
FIG. 14 is a graph illustrating a typical horizontal FFP of the semiconductor light emitting device of the conventional example.

As illustrated in FIGS. 12A and 13B, a semiconductor light emitting device according to the present embodiment does not have the shape of a rectangle, but has the shape of a parallelogram. Since the multilayer structure is a hexagonal crystal, a front facet 12 and a rear facet 13 are cleavage planes, but left and right facets which are perpendicular to the front facet 12 and the rear facet 13 are not cleavage planes, and in general, division of elements is performed by scribing by a diamond stylus or a laser. Thus, simply changing a scribing direction results in an inclined dividing direction, and thus elements having inclined lateral facets (left and right facets) 18 which have fine asperities can be very easily formed. Moreover, since a scribed surface is a rough surface having fine asperities, the scribed surface has a high degree of scattering effect, and is suitable for scattering of escaped light. Moreover, when the lateral facets 18 are inclined, facets of an element which lay side-by-side with the straight waveguide section 14a can be formed, which can reduce the width and the area of the element, so that it is possible to reduce cost. In the present embodiment, the device in which the lateral facets 18 lay side-by-side with the straight waveguide section 14a has been described, but the lateral facets 18 are preferably parallel to the straight waveguide section 14a. Moreover, an angle between the lateral facet 18 and the normal to the front facet 12 and a distance from the waveguide are preferably adjusted such that before light escaped from the curved waveguide section 14b reaches the front facet 12, the light is scattered by the lateral facet 18, and is emitted outside regardless of whether or not the facet 18 is parallel to the straight waveguide section 14a. This can ensure scattering of the light escaped from the curved waveguide section 14b by the lateral facet 18, so that it is possible to reduce light which escapes from the front facet 12. Thus, it is possible to reduce distortion of a horizontal FFP.

According to the semiconductor light emitting device of the fifth embodiment, it is possible to provide a low-cost SLD device which can produce a very satisfactory and horizontal FFP without distortion, and has a reduced area of the elements. Moreover, it is also possible to provide a device having high efficiency.

In the above embodiments, a blue (B) SLD light source has been described. However, for example, when gallium arsenic (GaAs), aluminum gallium phosphide (AlGaP), and the like are used, and a compositional ratio of the materials and a material system are modified, red (R) and green (G) SLD light sources can also be obtained. The RGB SLD light sources can serve as SLD displays having high color-reproducibility and color-filterless liquid crystal display devices including RGB backlights, as well as light sources for mobile projectors, etc.

As described above, the semiconductor light emitting device according to the present disclosure improves luminous efficiency, can provide a highly efficient semiconductor light emitting device having high directivity, high polarization performance, and low coherence, and is useful for super luminescent diodes (SLDs) or the like which emit light in the visible range from blue-violet to red.

What is claimed is:

1. A semiconductor light emitting device comprising:
a multilayer structure formed on a substrate and including a plurality of semiconductor layers including a light-emitting layer; wherein
the multilayer structure includes an optical waveguide having a ridge structure provided at an upper part of the multilayer structure,
the multilayer structure includes a first region and a second region in a plan view, and the optical waveguide is disposed between the first region and the second region in the plan view,
the optical waveguide extends from a front facet to a rear facet of the multilayer structure, and includes a straight waveguide section which is inclined to a normal to the front facet of the multilayer structure and extends from the front facet, and a curved waveguide section which perpendicularly reaches the rear facet of the multilayer structure,
the curved waveguide section is formed at a position closer to the rear facet of the multilayer structure than a center of the optical waveguide is,
in the plan view, a first angle between the front facet and the straight waveguide section in the first region is smaller than a second angle between the front facet and the straight waveguide section in the second region, and
a first groove is formed in the first region of the multilayer structure and spaced apart from the optical waveguide.

2. The semiconductor light emitting device of claim 1, wherein
a high reflectance film including a plurality of dielectric films is formed on the rear facet of the multilayer structure.

3. The semiconductor light emitting device of claim 2, wherein
an extremely-low-reflectance film including one or more dielectric films is formed on the front facet of the multilayer structure.

4. The semiconductor light emitting device of claim 1, wherein
an extremely-low-reflectance film including one or more dielectric films is formed on the front facet of the multilayer structure.

5. The semiconductor light emitting device of claim 1, wherein
the first groove extends in a zigzag in the plan view.

6. The semiconductor light emitting device of claim 1, wherein
the first groove extends in a straight line in the plan view.

7. The semiconductor light emitting device of claim 6, wherein
an angle between a normal in a longitudinal direction of the straight line and a direction in which the straight waveguide section extends is larger than a critical angle.

8. The semiconductor light emitting device of claim 1, wherein
a radius of curvature of the curved waveguide section is 1000 μm or larger.

9. The semiconductor light emitting device of claim 1, wherein
an angle between the straight waveguide section and the normal to the front facet of the multilayer structure is larger than or equal to 4° and is smaller than or equal to Brewster's angle.

10. The semiconductor light emitting device of claim 1, wherein
the semiconductor light emitting device is a super luminescent diode element configured to emit stimulated emission light from the front facet of the multilayer structure.

11. The semiconductor light emitting device of claim 1, wherein
the semiconductor layer includes a layer made of a group III nitride semiconductor expressed as $Al_xGa_yIn_{1-x-y}N$, where $0 \leq x \leq 1$, $0 \leq y \leq 1$, and $0 < x+y < 1$.

12. The semiconductor light emitting device of claim 1, wherein
the semiconductor layer includes a layer made of a group III-V compound semiconductor expressed as $Al_xGa_yIn_{1-x-y}As_zP_{1-z}$, where $0 \leq x \leq 1$, $0 \leq y \leq 1$, $0 \leq z \leq 1$, and $0 < x+y < 1$.

13. The semiconductor light emitting device of claim 1, wherein the first groove penetrates the light-emitting layer.

14. A semiconductor light emitting device comprising:
a multilayer structure formed on a substrate and including a plurality of semiconductor layers including a light-emitting layer; wherein
the multilayer structure includes an optical waveguide having a ridge structure provided at an upper part of the multilayer structure,
the multilayer structure includes a first region and a second region in a plan view, and the optical waveguide is disposed between the first region and the second region in the plan view,
the optical waveguide extends from a front facet to a rear facet of the multilayer structure, and includes a straight waveguide section which is inclined to a normal to the front facet of the multilayer structure and extends from the front facet, and a curved waveguide section which perpendicularly reaches the rear facet of the multilayer structure,
the curved waveguide section is formed at a position closer to the rear facet of the multilayer structure than a center of the optical waveguide is,
in the plan view, a first angle between the front facet and the straight waveguide section in the first region is smaller than a second angle between the front facet and the straight waveguide section in the second region,
the multilayer structure has lateral facets, and
the lateral facets have a lower degree of flatness than the front facet and the rear facet of the multilayer structure, incline from a normal direction of the front facet in a same direction as the straight waveguide section, and are formed side-by-side with the straight waveguide section.

15. The semiconductor light emitting device of claim 14, wherein
the lateral facets of the multilayer structure are parallel to the straight waveguide section.

16. A semiconductor light emitting device comprising:
a multilayer structure formed on a substrate and including a plurality of semiconductor layers including a light-emitting layer; wherein
the multilayer structure includes an optical waveguide having a ridge structure provided at an upper part of the multilayer structure,
the multilayer structure includes a first region and a second region in a plan view, and the optical waveguide is disposed between the first region and the second region in the plan view,
the optical waveguide extends from a front facet to a rear facet of the multilayer structure, and includes a straight waveguide section which is inclined to a normal to the front facet of the multilayer structure and extends from the front facet, and a curved waveguide section which perpendicularly reaches the rear facet of the multilayer structure,
the curved waveguide section is formed at a position closer to the rear facet of the multilayer structure than a center of the optical waveguide is,
in the plan view, a first angle between the front facet and the straight waveguide section in the first region is smaller than a second angle between the front facet and the straight waveguide section in the second region, and
a layer which absorbs light is disposed in the first region of the multilayer structure and spaced apart from the optical waveguide.

17. The semiconductor light emitting device of claim 16, wherein
a radius of curvature of the curved waveguide section is 1000 μm or larger.

18. The semiconductor light emitting device of claim 16, wherein
an angle between the straight waveguide section and the normal to the front facet of the multilayer structure is larger than or equal to 4° and is smaller than or equal to Brewster's angle.

19. The semiconductor light emitting device of claim 16, wherein
the semiconductor light emitting device is a super luminescent diode element configured to emit stimulated emission light from the front facet of the multilayer structure.

20. The semiconductor light emitting device of claim 16, wherein the semiconductor layer includes a layer made of a group III nitride semiconductor expressed as $Al_xGa_yIn_{1-x-y}N$, where $0 < x < 1$, $0 < y < 1$, and $0 < x+y < 1$.

21. The semiconductor light emitting device of claim 16, wherein
the semiconductor layer includes a layer made of a group III-V compound semiconductor expressed as $Al_xGa_yIn_{1-x-y}As_zP_{1-z}$, where $0 \leq x \leq 1$, $0 \leq y \leq 1$, $0 \leq z \leq 1$ and $0 \leq x+y \leq 1$.

* * * * *